United States Patent
Lee et al.

(10) Patent No.: US 10,057,981 B2
(45) Date of Patent: Aug. 21, 2018

(54) STRETCHABLE CIRCUIT BOARD AND METHOD OF MANUFACTURING THE SAME

(71) Applicant: INDUSTRY FOUNDATION OF CHONNAM NATIONAL UNIVERSITY, Gwangju (KR)

(72) Inventors: Dong-Weon Lee, Gwangju (KR); Guangyong Li, Gwangju (KR)

(73) Assignee: Industry Foundation of Chonnam National University, Gwangju (KR)

( * ) Notice: Subject to any disclaimer, the term of this patent is extended or adjusted under 35 U.S.C. 154(b) by 0 days.

(21) Appl. No.: 15/141,867

(22) Filed: Apr. 29, 2016

(65) Prior Publication Data

US 2016/0366760 A1    Dec. 15, 2016

(51) Int. Cl.
| | |
|---|---|
| H05K 1/00 | (2006.01) |
| H05K 1/02 | (2006.01) |
| H05K 3/00 | (2006.01) |
| H05K 3/24 | (2006.01) |

(52) U.S. Cl.
CPC .......... H05K 1/0283 (2013.01); H05K 3/007 (2013.01); H05K 3/246 (2013.01); *H05K 2201/0133* (2013.01); *H05K 2201/0314* (2013.01); *H05K 2203/016* (2013.01)

(58) Field of Classification Search
CPC ...... H05K 1/0283; H05K 3/007; H05K 3/246; H05K 2203/016; H05K 2201/0133; H05K 2201/0314
USPC .......................... 174/254, 250, 251, 255–258
See application file for complete search history.

(56) References Cited

U.S. PATENT DOCUMENTS

| | | | | |
|---|---|---|---|---|
| 3,959,874 | A * | 6/1976 | Coucoulas .......... | H01L 23/3121 174/528 |
| 2007/0194456 | A1* | 8/2007 | Cohn ................ | H01L 23/49811 257/778 |
| 2009/0310322 | A1* | 12/2009 | Koh ...................... | H01L 21/563 361/783 |
| 2010/0181104 | A1* | 7/2010 | Hotta ..................... | H05K 3/421 174/266 |
| 2015/0311177 | A1* | 10/2015 | Park ........................ | H01L 24/81 257/738 |
| 2015/0359095 | A1* | 12/2015 | Murakawa ............... | C09D 5/00 174/257 |

(Continued)

FOREIGN PATENT DOCUMENTS

| | | |
|---|---|---|
| KR | 10-2010-0123755 A | 11/2010 |
| KR | 10-2014-0121325 A | 10/2014 |

*Primary Examiner* — Tremesha S Willis
(74) *Attorney, Agent, or Firm* — Rabin & Berdo, P.C.

(57) ABSTRACT

A stretchable circuit board has stretchability as well as flexibility of the flexible substrate and retains mechanical and electrical properties even under larger deformation such as bending, twisting, etc. The liquid metal pattern can exhibit stretchability almost the same as that of the polymer substrate due to the liquid metal being fully wetted on the substrate with metal patterns based on the wetting behavior of the liquid metal. Therefore, the stretchable circuit board can achieve both mechanical and electrical properties even under physical deformation such as bending, stretching and twisting. It is demonstrated that the stretchable circuit board can be effectively applied to wearable tactile interfaces, stretchable solar cell arrays, stretchable displays, and wearable electronic devices.

11 Claims, 10 Drawing Sheets

(56) References Cited

U.S. PATENT DOCUMENTS

2016/0057866 A1\* 2/2016 Shimoda ............... H01L 23/481
                                                            174/257

\* cited by examiner

STRETCHABLE CIRCUIT BOARD AND METHOD OF MANUFACTURING THE SAME

BACKGROUND OF THE INVENTION

1. Field of the Invention

This invention describes a manufacture technique of stretchable circuit board with the capability of large deformation. The stretchable circuit board exhibits stable electrical and mechanical properties even under various conditions such as bending, twisting, or off-axis stretching.

2. Description of the Related Art

A printed circuit board (PCB), in which a copper line is thinly printed, can mechanically support and electrically connect various electronic components, such as a semiconductor, a condenser and a resistor. The printed circuit board is used to decrease the size of an electronic device and to increase the performance.

A printed circuit board is widely employed as the carrier of integrated circuits (ICs) in electronic devices, which are fundamentally rigid and planar. However, human bodies and nature are shown in the form of soft curves usually. Therefore, the printed circuit boards without flexibility seriously limit its applications. In order to overcome the mismatch between the rigid plane and the soft curve, various flexible substrates are developed to realize the commercial wearable device as a next-generation smart device. A conventional method of manufacturing the flexible board is used a metal to deposit on the surface of a flexible substrate. Conventionally, a metal such as gold (Au), platinum (Pt), or silver (Ag) is deposited in a vapor state on the surface of a substrate such as polydimethylsiloxane (PDMS), silicone rubber, or acryl rubber. After deposition, a pattern is formed on the substrate and to realize the flexible circuit board.

Although the fabricated circuit board exhibits stable electrical properties under bending deformation, the metal pattern layer is stripped from the surface of a flexible substrate under tensile deformation of 10% or more, undesirably deteriorating electrical conductivity.

Therefore, stripping problems between the metal layer and the stretchable substrate are conventionally solved by mixing a polymer with carbon nanotubes (CNT), carbon black (CB), or graphite to form a circuit pattern using the mixture conductive material. The fabricated stretchable circuit board advantageously exhibits stable electrical properties even under a tensile deformation of 100% or more. However, the electrical conductivity is undesirably low.

Recently, a variety of stretchable electronic devices based on a wave-shaped serpentine pattern have been reported by Wagner et al. and Rogers et al. The stretchable electronic device requires complicated processing because a wave-shaped pattern has to be formed.

In this regard, Korean Patent Application Publication Nos. 10-2010-0123755 (Stretchable and Foldable Electronic Devices) and 10-2014-0121325 (Stretchable Electric Device and Manufacturing Method of the Same) are provided.

SUMMARY OF THE INVENTION

Accordingly, the present invention is intended to provide a stretchable circuit board that retains mechanical and electrical properties even under bending and tensile deformation, and a method of manufacturing the stretchable circuit board. The circuit pattern is easily performed on soft substrate and the manufacturing process is very easy In order to accomplish the above objects, the present invention provides a method of manufacturing a stretchable circuit board, which comprise steps of: (a) forming a first polymer layer on the surface of a wafer; (b) forming a pattern on a metal film deposited on the surface of the first polymer layer by using lithography technique; (c) plating liquid metal on the pattern; and (d) removing redundant liquid metal from the wafer, wherein the step (c) is performed using the wettability of the liquid metal, which depends on the surface properties of the material contacting with liquid metal. During the manufacture process, the step (a) is performed by coating polydimethylsiloxane (PDMS) on the surface of the wafer.

The step (b) is performed by depositing metal on the first polymer layer formed in the step (a). The metal is selected from the group including gold (Au), chromium (Cr), silver (Ag), aluminum (Al), copper (Cu), platinum (Pt), zinc (Zn), nickel (Ni), tin (Sn), iron (Fe), and so on. After deposition, desired pattern is formed by using lithography technique.

The liquid metal used in the step (c) is Galinstan comprised by gallium, indium and tin.

The step (c) comprises: removing the oxidation surface of liquid metal with an acid vapor; and plating the reduced liquid metal on the pattern obtained during the step (b), wherein the reduced liquid metal has higher wettability on a surface of a metal material than a polymer material.

During the step of (c), removing the oxidation surface of liquid metal is performed by the vapor of hydrochloric acid (HCl) solution (with a concentration of 15 to 37 wt %). The reduced liquid metal droplet is rolled on the desired regions which have metal pattern. The rolling time is 5 to 30 sec.

The step (b) comprises: coating the surface of the first polymer layer with a metal film; and forming a desired pattern by lithography technique.

During the step (b), the coating step comprises: forming a chromium layer by coating the surface of the first polymer layer with chromium (Cr); and coating the chromium layer with gold (Au).

After the step (c), the second polymer layer is coated on the surface which is selectively plated with the reduced liquid metal.

In addition, the present invention provides a stretchable circuit board, which is composed of a polymer substrate, a metal circuit pattern coated on the surface of the substrate and a reduced liquid metal plated on a surface of the metal circuit pattern so that an externally applied signal may electrically pass through the pattern. Here, the liquid metal is Galinstan. According to the present invention, the stretchability of the liquid metal-plated metal pattern almost sames to that of the polymer substrate. Thus, the liquid metal-plated metal pattern can achieve both stable mechanical and electrical properties even under physical deformation such as bending, stretching, and twisting.

During the manufacture of a stretchable circuit board, the reduced liquid metal is plated on the metal pattern based on its wettability. The wettability varies depending on the surface properties of the material contacting with the reduced liquid metal. Due to the polymer substrate and the circuit pattern formed on the surface thereof are neither stripped nor broken under physical deformation and are stretchable. Thus they can be applied to wearable tactile interfaces, stretchable solar cell arrays, stretchable displays, and other wearable electronic devices.

In addition, the circuit pattern with a uniform pattern edge can be formed based on the selective wettability of the reduced liquid metal even with milli/microscale.

BRIEF DESCRIPTION OF THE DRAWINGS

The other objects, features and advantages of the invention will be more clearly described in the following figures, in which.

DESCRIPTION OF SPECIFIC EMBODIMENTS

Hereinafter, more details are described in the present invention referenced to the appended drawings, and the present invention is not limited to the exemplary embodiments. Throughout the drawings, the reference numerals refer to members are marked in the figures.

The objects and effects of the present invention are easily understood, the more details are fully explained by the following description, and they are not limited only by such a description.

In the following description of the present invention, detailed descriptions of known functions and components incorporated herein will be omitted when it may make the subject matter of the present invention unclear.

Figure 1A:
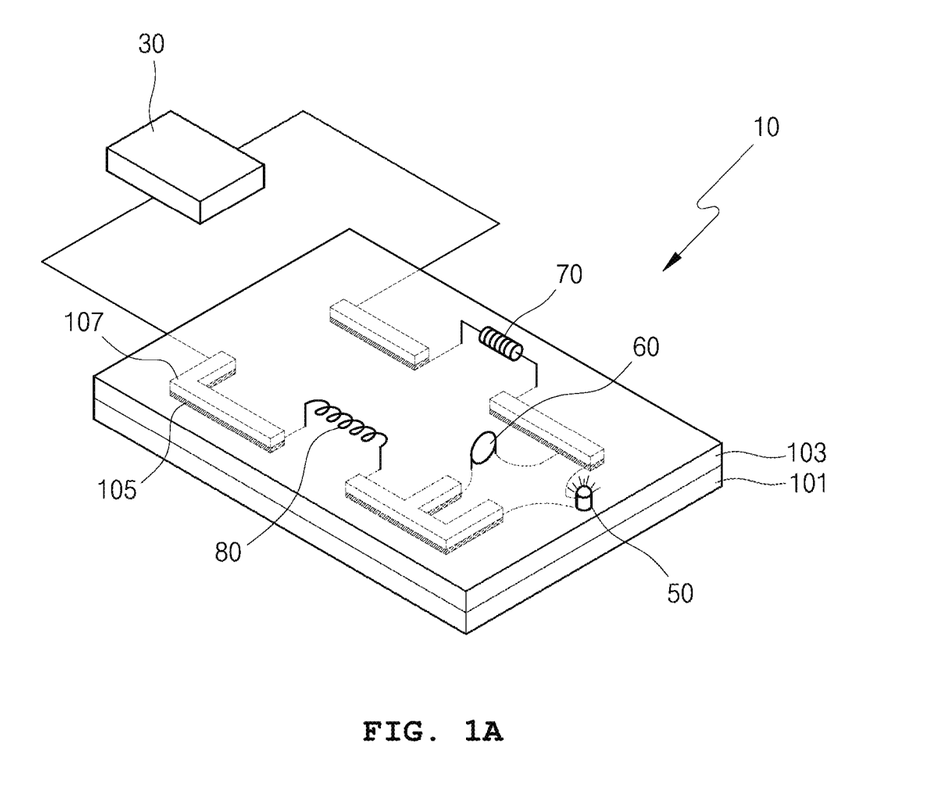
FIG. 1A illustrates the sketch of a stretchable circuit board according to an embodiment of the present invention.
Figure 1B:
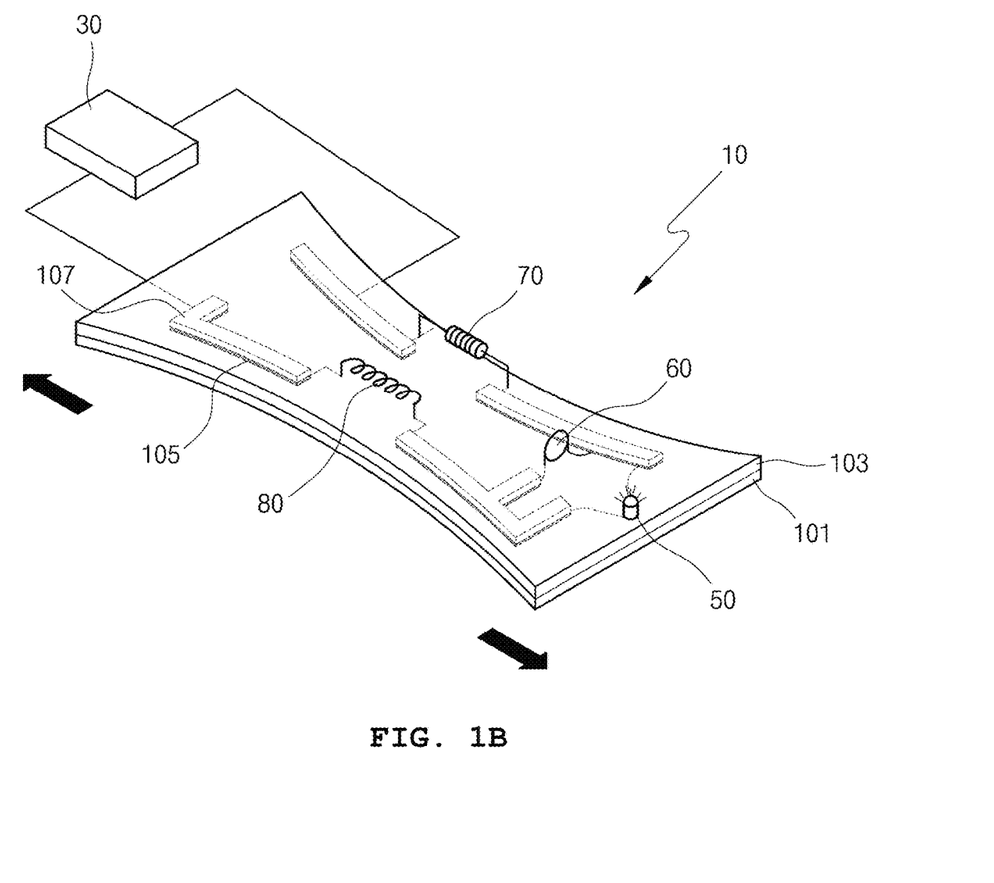
FIG. 1B illustrates the sketch of the stretchable circuit board according to an embodiment of the present invention, which is stretched.

FIGS. 1A and 1B illustrate a stretchable circuit board 10 according to an embodiment of the present invention. FIG. 1A illustrates the stretchable circuit board applied with an input power supply and connected with an output device, and FIG. 1B illustrates the stretchable circuit board, which is stretched by tensile force.

According to FIGS. 1A and 1B, the stretchable circuit board 10 is applied with a current from a power supply 30. In the present embodiment, a device for checking output, namely a light-emitting diode (LED) 50, may be provided with the stretchable circuit board 10. Also, the stretchable circuit board 10 includes additional electronic parts for driving circuits, such as a capacitor 60, a resistor 70 and an inductor 80.

In the present embodiment, the stretchable circuit board 10 includes a polymer substrate 101, a metal film 105, a liquid metal 107, and a polymer layer 103 formed on the surface of the liquid metal 107.

In the present embodiment, the substrate 101 is a polymer material. The metal film 105 is coated in the form of a circuit pattern on the surface of the polymer substrate 101. The liquid metal 107 is plated on the surface of the metal film 105 so that an externally applied signal is electrically passed through the pattern by the input unit 30.

The liquid metal 107 is Galinstan, comprising gallium, indium and tin, which are alloyed. Galinstan is an alloy comprising 68.5 wt % of gallium (Ga), 21.5 wt % of indium (In) and 10 wt % of tin (Sn), and has a low melting point (−19° C.), a high boiling point (1300° C.), high electrical conductivity ($3.46 \times 10^6$ $Sm^{-1}$), high thermal conductivity (16.5 $Wm^{-1}K^{-1}$), and ultralow vapor pressure.

Also, Galinstan is characterized in that it is easily oxidized in the air, and thus a gel-phase viscous oxide film is formed on the surface thereof. The oxide film of the liquid metal 107 can be removed with a vapor of an acid solution.

The liquid metal 107 is Galinstan in which the oxidation surface is removed by using the vapor of the acid solution. Galinstan without oxidation surface exhibits higher wettability on the surface of the metal material than the polymer material.

Due to the liquid metal 107 plated on the surface of the metal film 105, the stretchability of the circuit pattern coated on the surface of the polymer substrate 101 approximately equivalents to that of the polymer substrate 101. Thus, the stretchable circuit board according to the present invention may retain its mechanical and electrical properties even under deformation, such as bending, twisting, and stretching, as illustrated in FIG. 1B.

Figure 2:
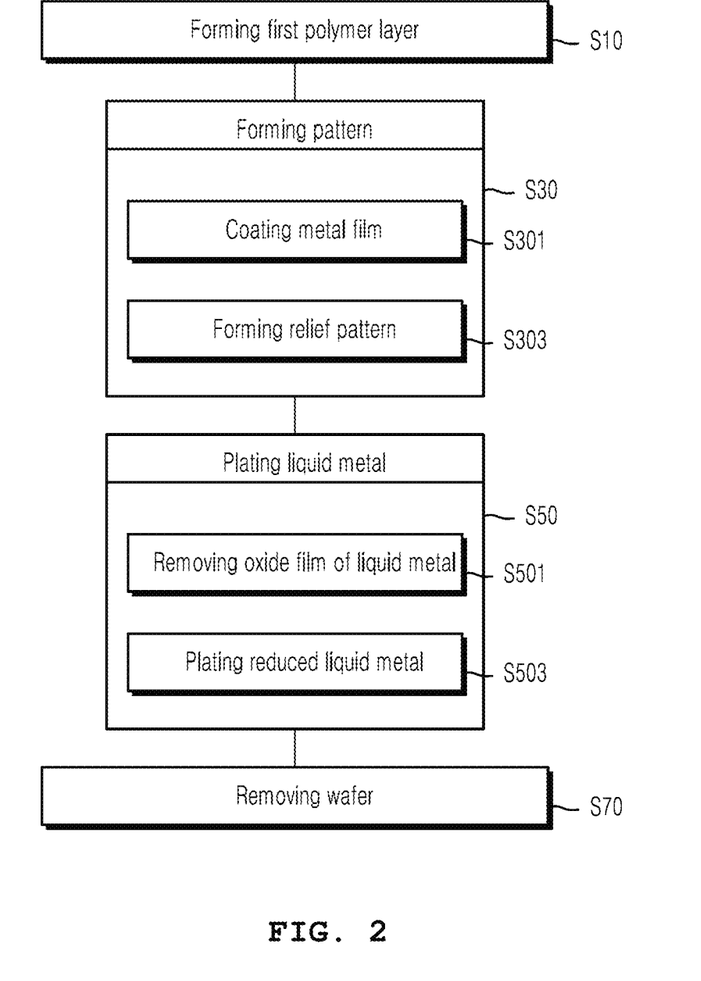
FIG. 2 is a block diagram illustrating the process of manufacturing a stretchable circuit board according to an embodiment of the present invention.
Figure 3:
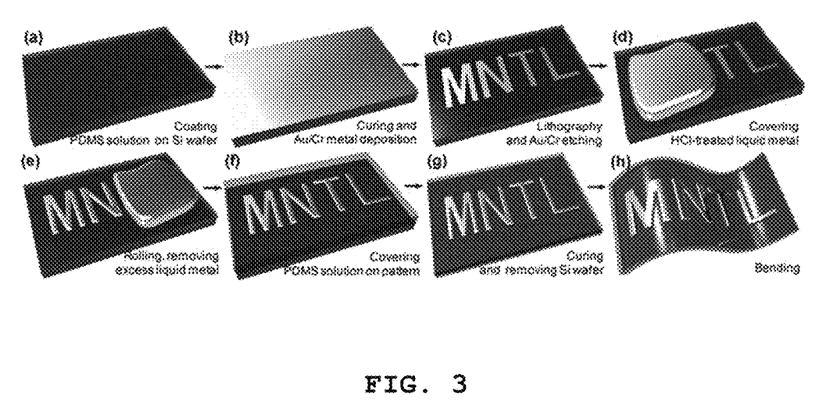
FIG. 3 schematically illustrates the process of manufacturing a stretchable circuit board according to an embodiment of the present invention.

FIG. 2 is a block diagram illustrating the process of manufacturing the stretchable circuit board 10 according to an embodiment of the present invention. According to FIG. 2, the method of manufacturing the stretchable circuit board 10 may include the steps of forming a first polymer layer (S10), forming a pattern (S30), plating a liquid metal (S50), and removing a wafer (S70).

In the step of forming the first polymer layer (S10), polydimethylsiloxane (PDMS) is coated on the surface of a wafer (not shown). Thus, the formed first polymer layer 101 comprises a polymer substrate. Specifically, the first polymer layer (S10) is formed by coating PDMS solution on the silicon wafer (Si wafer) which has a silicon oxide layer 500 nm thick with a spin coater at a rate of 800 rpm for 30 sec. Thereafter, the PDMS-coated wafer is cured on a hot plate at 80° C. for 90 min.

The step of forming the pattern (S30) includes coating a metal film (S301) and forming a relief pattern (S303).

In the step of coating the metal film (S301), the surface of the first polymer layer 101 is coated with a metal film. The step of coating the metal film (S301) includes forming a chromium layer by coating the surface of the first polymer layer with chromium (Cr), followed by coating the chromium layer with gold (Au).

In the step of coating the metal film (S301), the metal film is formed and make sure that it is not etched by an acid contained in the liquid metal 107 in the subsequent step of plating the liquid metal (S50). The metal that is not etched by an acid contained in the liquid metal 107 is favorable in terms of forming a metal pattern having a uniform pattern edge. In the present embodiment, the metal used in the step of coating the metal film (S301) may include gold (Au), chromium (Cr), silver (Ag), aluminum (Al), copper (Cu), platinum (Pt), zinc (Zn), nickel (Ni), tin (Sn), iron (Fe), and combinations thereof. Particularly, the optimal coating metal is gold (Au) or a combination of gold and chromium (Au/Cr).

The step of forming the chromium layer is performed by coating Cr on PDMS with a thickness of 10 nm, which is coated on the surface of the wafer with the first polymer layer (S10), using an electron beam evaporator.

In the process of coating Au, Au is sequentially coated on the Cr-coated surface with a thickness of 100 nm. Thus, the Au/Cr layer is formed and function as a seed layer for plating the liquid metal 107.

In the step of forming the pattern (S30), the relief pattern (S303) is formed by typical lithography. Specifically, the metal film 105, which is formed on the surface of the first polymer layer in the step of coating the metal film (S301), is etched, thus forming a relief pattern.

The step of plating the liquid metal (S50) includes removing the oxidation surface of the liquid metal (S501) and plating the reduced liquid metal (S503).

The term "liquid metal" refers to a liquid is originated from metal ions and free electrons, such as mercury or fused metal, and has an electrically conductive property due to the action of free electrons. Such a liquid metal is known to the wetting behavior, which has a contact angle of 20° or less on a solid metal based on the Robertson dissolution-diffusion model.

However, some liquid metals may maintain a large contact angle of 90° or more when it contacts with a solid metal. In the present embodiment, the liquid metal 107 with above behavior is Galinstan (Geratherm Medical AG, Germany), which is a commercially available alloy comprising gallium, indium and tin (68.5% Ga, 21.5% In, 10% Sn).

The reason why Galinstan 107 has a large contact angle of 90° or more when adsorbed onto a solid metal is due to that it is oxidized and has an oxidation layer on its surface. Galinstan 107 does not induce wetting behavior on the surface of the solid metal due to the oxidation surface, and behaves like a viscous gel. The oxidation surface formed on the surface of the oxidized liquid metal 107 can be removed through the step of removing the oxidation layer of the liquid metal (S501).

In the step of removing the oxidation surface (S501), Oxidized Galinstan is reduced by using a vapor of any one acid solution selected from among hydrochloric acid (HCl), hydrofluoric acid (HF) and nitric acid ($HNO_3$).

The concentration of the acid solution for using to remove the oxidation surface of liquid metal 107 is very important. If the concentration of the acid solution is low, the oxidation surface is not completely removed from the surface of the liquid metal. It is difficult to cause a wetting phenomenon such that the metal pattern, as a seed pattern layer, is fully wetted with liquid metal. On the other hand, if the acid solution has a high concentration, the metal pattern is etched. It is difficult to form a circuit pattern with a uniform pattern edge.

Figure 6:
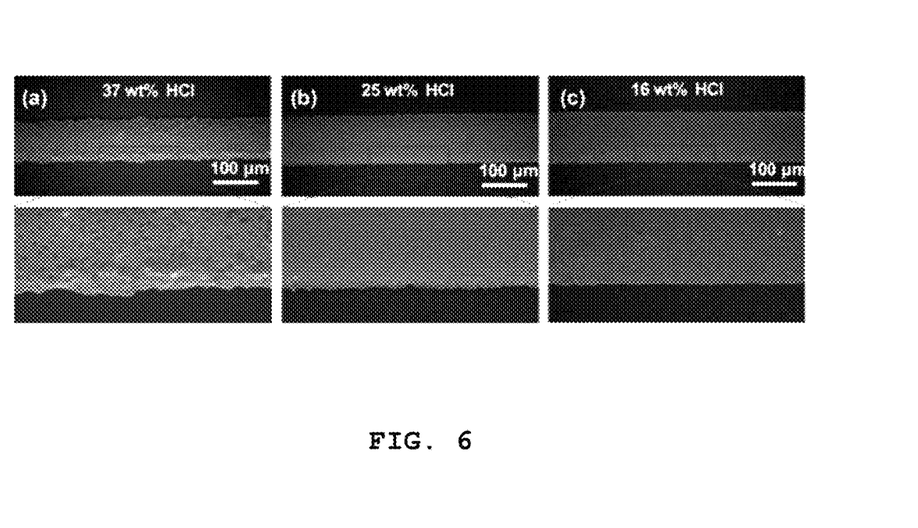
FIG. 6 is SEM images illustrating the edge uniformity of liquid metal patterns with different concentrations of acid solution to remove the oxidation surface of liquid metal.

In the present embodiment, to determine the optimal concentration of the hydrochloric acid solution for efficiently removing the oxidation surface of Galinstan, 37 wt %, 25 wt %, and 16 wt % hydrochloric acid solutions are prepared and used to remove the oxidation layer from Galinstan surface. After rolling the reduced liquid metal on the first polymer layer with metal patterns for 5 sec, the liquid metal-plated pattern is observed using SEM.

As illustrated in FIGS. 6(a) and 6(b), the liquid metal patterns are formed by rolling the reduced liquid metal. The oxidation surface is removed by using 37 wt % and 25 wt % hydrochloric acid solutions. Due to the strong oxidation reaction caused in the metal layer, it can damage the edge of the liquid metal pattern. On the other hand, the liquid metal pattern formed by rolling Galinstan treated with a 16 wt % hydrochloric acid solution has a uniform pattern edge. Hence, in the present embodiment, the oxidation surface is removed from the surface of oxidized Galinstan by using a 16 wt % hydrochloric acid solution.

In the step of plating the reduced liquid metal (S503), the pattern is plated with the reduced liquid metal 107 after the step of removing the oxidation surface (S501). In the step of plating the reduced liquid metal (S503) according to the present embodiment, the surface of the first polymer layer with the relief metal pattern formed in the step of forming the pattern (S30) is covered with reduced Galinstan. After rolling, the liquid metal 107 is plated on the pattern.

Figure 4:
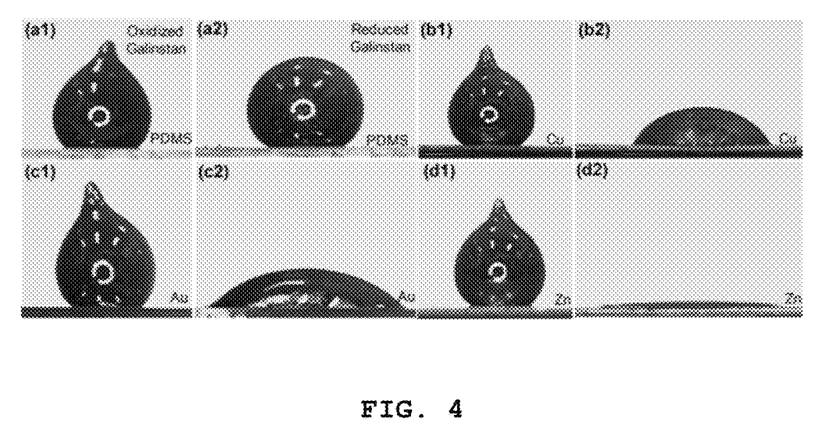
FIG. 4 illustrates the difference wettability of the oxidized liquid metal and reduced liquid metal contacting with the metal surface and the non-metal surface.

As shown in FIGS. 4(a1), 4(a2), 4(b1), 4(b2), 4(c1), 4(c2), 4(d1) and 4(d2), the wettability of reduced Galinstan varies depending on the surface of material that is in contact with the reduced liquid metal. Seen from FIGS. 4(a1), 4(a2), 4(b1), 4(b2), 4(c1), 4(c2), 4(d1) and 4(d2), when Galinstan is oxidized, wetting does not occur on the PDMS layer, corresponding to the polymer substrate 101, and on the metal layer comprising Cu, Au, Zn. The contact angle is about 125°–. The oxidized Galinstan shows gel-like behavior (FIGS. 4(a1), 4(b1), 4(c1), and 4(d1)).

Meanwhile, reduced Galinstan exhibits lyophobicity with a contact angle of 90° or more on the PDMS layer (FIG. 4(a2)), and superlyophilic and superlyophobic characteristics on the metal layer such as Cu, Au and Zn (FIGS. 4(b2), 4(c2), and 4(d2)).

In the present embodiment, when reduced Galinstan droplet is plated on the surfaces of the metal film 105 with a pattern and the polymer substrate 101 without pattern, the pattern made by Au is fully wetted with reduced Galinstan. Thereafter, when the remaining Galinstan droplets are removed from the surface of the polymer, a liquid metal pattern is formed.

Figure 5:
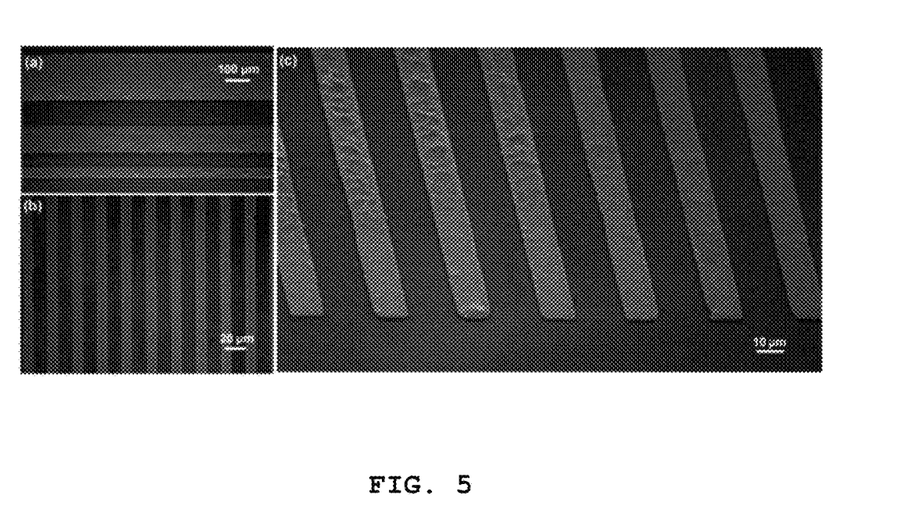
FIG. 5 is scanning electron microscope (SEM) images illustrating liquid metal patterns according to an embodiment of the present invention.

The process of the invention for plating the liquid metal based on the wettability of the reduced liquid metal, which varies depending on the surface of the material that is in contact with the reduced liquid metal. It is referred to as "selective liquid-metal plating (SLIM)". The liquid metal pattern formed by the SLIM process has a uniform pattern edge with a resolution of 10 μm, as illustrated in FIGS. 5(a) to 5(c).

Figure 7:
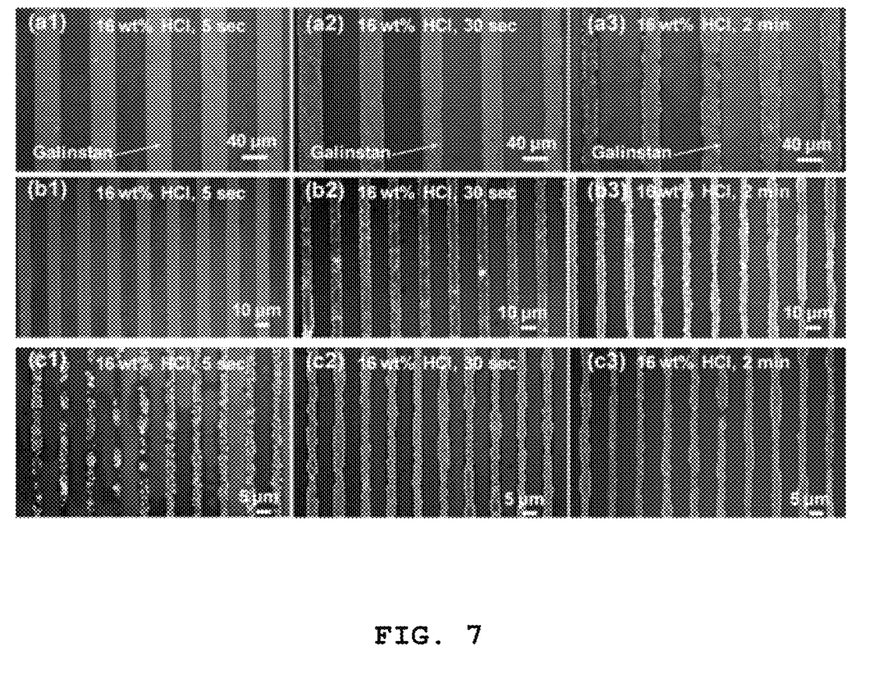
FIG. 7 is SEM images illustrating the uniformity of liquid metal patterns with different rolling times (the time of the reduced liquid metal rolling on the surface of the metal pattern-formed substrate)
Figure 8:
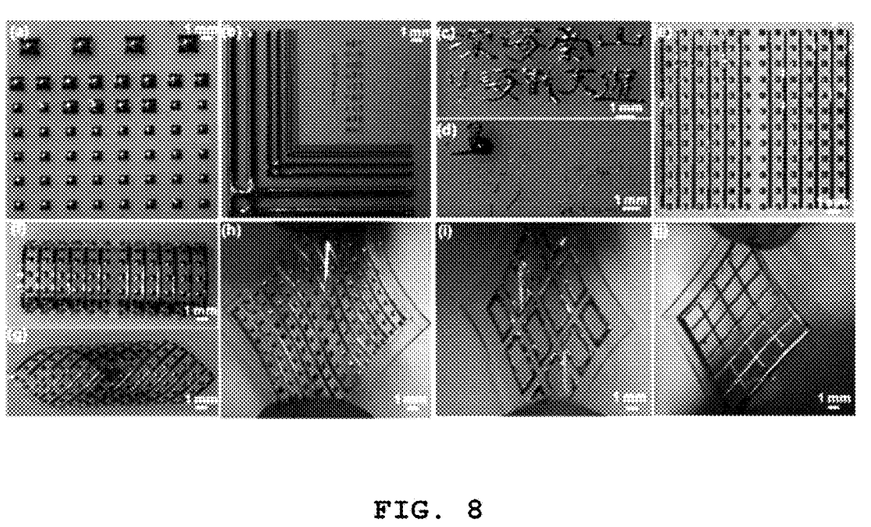
FIG. 8 illustrates the liquid metal pattern and the stretchable circuit board including the same pattern, according to the present invention, wherein the mechanical properties of the circuit board and the circuit pattern are maintained even under deformation such as bending and stretching.

Furthermore, the time of rolling the reduced Galinstan in the present embodiment has an influence on the uniformity of the formed liquid metal pattern having a uniform edge. Thus, in order to evaluate the rolling time, the following test is performed. Specifically, substrates with different widths of 40 μm, 10 μm, and 5 μm metal patterns are plated with the reduced liquid metal for 5 sec, 30 sec, and 2 min. Here, the oxidation surface of Galinstan is removed by using a 16 wt % hydrochloric acid solution.

As illustrated in FIGS. 7(a1) to 7(a3), 7(b1) to 7(b3), and 7(c1) to 7(c3), when the metal pattern has a width of 10 μm or more, the rolling time of 5 is enough to make sure that the reduced liquid metal can fully be wetted on the metal pattern and form a uniform pattern edge.

As shown in FIGS. 7(c1) to 7(c3), when the width of the metal pattern is 5 μm, the rolling time is required to be 30 sec or longer in order to completely wet the reduced liquid metal on the metal pattern.

Although it is difficult to form a uniform edge on a conductive pattern with a width of 5 μm or less, the pattern with a width of 10 μm is enough to meet the requirements of a stretchable circuit board in the present embodiment. Hence, the method of forming the liquid metal pattern using a liquid metal plating process according to the present invention can be widely utilized.

Thereafter, the surface of the first polymer layer with the pattern plated with the liquid metal 107 is washed with an acetone solution and cured on a hot plate at 60° C. for 10 min. After cured, the acetone solution is completely vaporized.

Also, the method of manufacturing the stretchable circuit board according to the present embodiment further includes forming the second polymer layer 103 on the surface plated with the liquid metal 107. The step of forming the second polymer layer 103 plays a role in the formation of an insulating layer for blocking the current that electrically passes through the liquid metal pattern formed on the surface of the substrate 101. The step of forming the second polymer layer 103 includes coating a polymer solution on the surface of the substrate 101 with the liquid metal pattern on a hot plate at 80° C. for 90 min. Therefore, the second polymer layer 103 is formed on the substrate 101. In the present embodiment, the polymer solution used for forming the second polymer layer 103 is polydimethylsiloxane (PDMS).

Also, the method of manufacturing the stretchable circuit board according to the present embodiment further includes removing the wafer (S70), used in the step of forming the first polymer layer (S10), after the formation of the second polymer layer 103. When the wafer under the substrate 101 is removed during the step of removing the wafer (S70), the substrate of the stretchable circuit board 10 is only a polymer material, which can increase the stretchability of the circuit board.

In addition, a method of manufacturing a stretchable circuit board 10 according to another embodiment of the present invention includes the steps of forming a pattern by coating metal film on the surface of a wafer and plating liquid metal on the formed pattern. The wettability of reduced liquid metal varies depending on the surface of material that is in contact with the reduced liquid metal.

In this case, unlike the embodiment of FIG. 2, a circuit board can be manufactured by directly coating the metal film 105 on the surface of the silicon wafer to form the pattern, without forming the first polymer layer, and plating a liquid metal 107 on the formed pattern.

In this way, the surface of the silicon wafer is coated with a thin chromium layer before coating with a gold layer. The coated chromium layer under the gold layer can enhance the deposition capability between the gold and the silicon oxide of the wafer.

Except the foregoing, the left procedures of manufacturing the circuit board are same as the description in FIG. 2.

The following is a description of the performance testing of the liquid metal pattern and the stretchable circuit board according to the present invention, which are shown in FIGS. 8 to 12.

Test Example 1: Analysis of Mechanical Properties of Stretchable Circuit Board

As illustrated in FIGS. 8(a) to 8(e), according to an embodiment of the present invention, a liquid metal pattern formed by plating a liquid metal 107 with a milli/microscale resolution is shown in the form of a square, a line and a letter on a polymer substrate 101.

In FIGS. 8(f) and 8(g), a stretchable circuit board including a liquid metal pattern with a line and square shape is manufactured and then applied with physical deformation such as bending. Consequently, the liquid metal pattern is not stripped from the substrate or is not broken, and the mechanical properties are maintained.

In FIGS. 8(h) to 8(j), even when the stretchable circuit board with the liquid metal pattern is applied with off-axis stretching, the liquid metal pattern is not stripped from the substrate or is not broken, and the mechanical properties are maintained.

Figure 9:
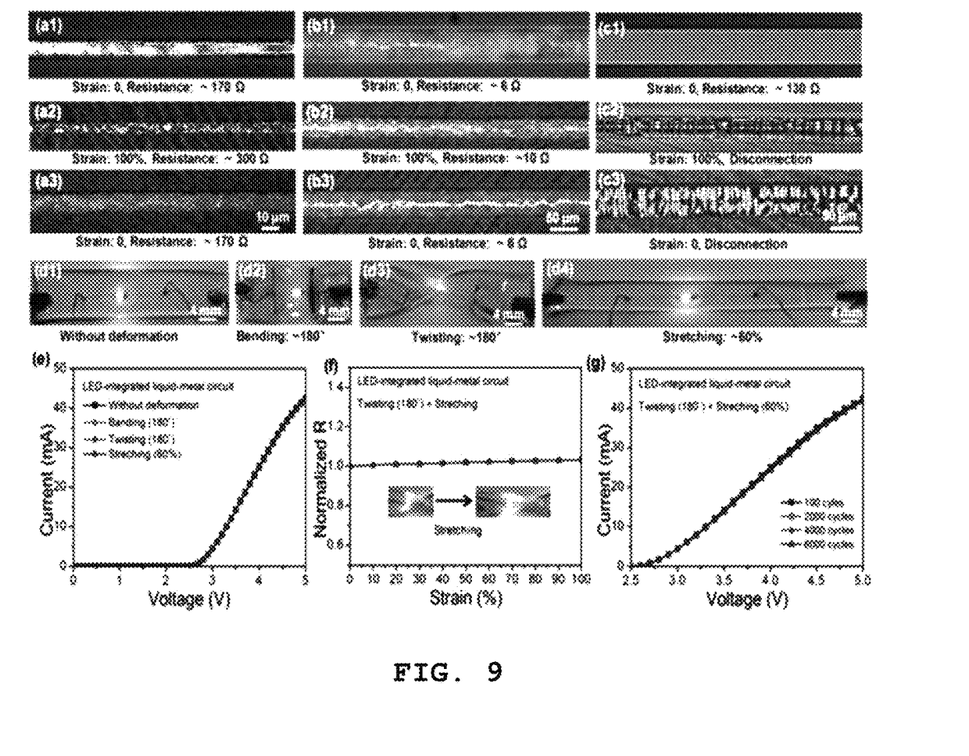
FIG. 9 illustrates the stretchable circuit board including the liquid metal wire according to the present invention, wherein the electrical properties are maintained even under deformation such as bending and stretching.
Figure 10:
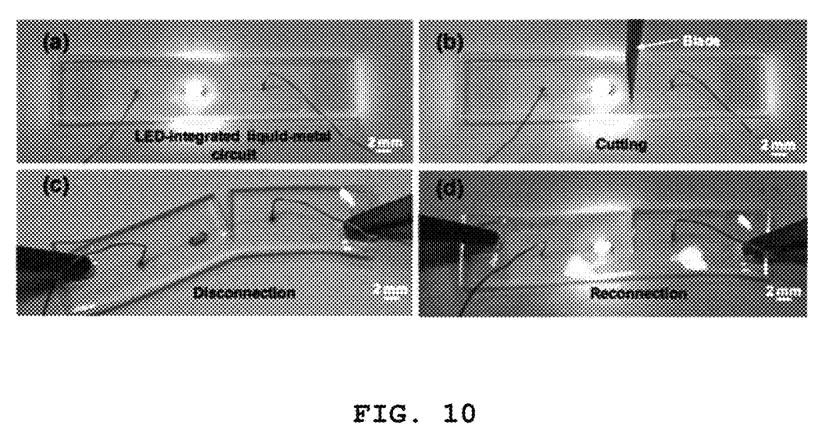
FIG. 10 illustrates the electrical self-healing characteristics of the stretchable circuit board including the liquid metal wire according to the present invention.

Test Example 2: Analysis of Electrical Properties of Stretchable Circuit Board 2-1. Analysis of Electrical Properties of Stretchable Circuit Board Including Liquid Metal Wire In order to evaluate whether the electrical properties of the stretchable circuit board according to an embodiment of the present invention are maintained even under deformation such as stretching, twisting or bending, stretchable circuit boards including a liquid metal wire with a width of 10 μm and a length of 20 mm and a liquid metal wire with a width of 50 μm and a length of 20 mm are manufactured, and the resistance R of the manufactured stretchable circuit boards are measured when the strain 100% is applied.

As illustrated in FIGS. 9(a1) to 9(a3), 9(b1) to 9(b3), 9(c1) to 9(c3), 9(d1) to 9(d4), 9(e), 9(f), and 9(g), when the stretchable circuit boards 10 including the liquid metal wires of 10 μm (FIGS. 9(a1) to 9(a3)) and 50 μm (FIGS. 9(b1) to 9(b3)) are stretched to 100% relative to the original length, the resistance values are increased with 130Ω and 4Ω, respectively.

Furthermore, when the stretched board is recovered to initial state, the resistance of the liquid metal wire returned to its initial value.

As shown in FIGS. 9(a3) and 9(b3), some cracks are formed on the surface of the liquid metal. This was due to the oxide layer of the liquid metal. Such cracks do not affect the electrical properties of the stretchable circuit board 10. Since the thickness of the cracked oxide layer is smaller than the diameter of the liquid metal wire, the liquid metal under the oxide layer has satisfactory electrical and mechanical properties.

As shown in FIGS. 9(c1) to 9(c3), when the conventional stretchable circuit board including the metal wire is stretched to 100% relative to the original length, it is disconnected. Even when the stretched board is recovered to its initial state, it is still disconnected.

Therefore, the electrical properties of the stretchable circuit board including the liquid metal wire according to an embodiment of the present invention are maintained even under stretching deformation and restoration.

2-2. Analysis of Electrical Properties of Stretchable Circuit Board Including Liquid Metal Wire Connected to Output Device (LED)

According to an embodiment of the present invention, a liquid metal wire and an LED device are connected, and a stretchable circuit board including them is manufactured.

The electrical properties of the stretchable circuit board are evaluated even after applied with various kinds of physical deformation.

Consequently, as shown in 9(d1) to 9(d4) (applied with an external voltage of 3 V), even after physical deformation (such as bending of 180°, twisting of 180°, or stretching 60%), the light is emitted from the LED device. It indicates that the electrical properties are stably maintained. The voltage-current characteristics can be seen in the graph of FIG. 9(e).

FIG. 9(f) shows the normalized resistance ($R=R_a/R_0$) when the stretchable circuit board 10 including the liquid metal wire connected with the LED device is stretched under the condition that it was twisted 180°.

Here, $R_a$ is the resistance when the stretching is applied, and $R_0$ is the resistance before stretching. Consequently, as shown in the graph of FIG. 9(f), the resistance value remained almost constant even when the board is stretched to 100% relative to the original length while being twisted 180°.

FIG. 9(g) shows the current-voltage characteristics when the stretchable circuit board, including the liquid metal wire connected with the LED device, is stretched to 60% with repeated 6,000 times under the condition that it is twisted 180°.

As illustrated in the graph, the current-voltage characteristics are maintained constant even under deformation repeated 6000 times, as in the case of deformation repeated 100 times, 2000 times and 4000 times. Thereby, the electrical properties of the stretchable circuit board including the liquid metal wire according to the present invention are maintained the same as before deformation, even after repeated physically large stretching deformation and restoration.

Test Example 3: Self-Healing Characteristics of Stretchable Circuit Board Including Liquid Metal Wire Connected to LED Device FIGS. 10(a) to 10(d) illustrate the self-healing characteristics of a stretchable circuit board 10 including a liquid metal wire according to the present invention. Specifically, the liquid metal wire and the LED device are connected, after which the stretchable circuit board including them is manufactured, and the wire portion is cut by scissors and disconnected. The circuit board is re-connected even in the absence of a physical force, whereby the electrical properties thereof are self-healed and light is emitted from the LED device.

Test Example 4: Analysis of Real-World Applicability and Efficiency of Stretchable Circuit Board In order to achieve real-world applicability of the stretchable circuit board including the liquid metal pattern (or wire) according to an embodiment of the present invention, the electrical properties must be maintained even when the board is under various deformations.

Therefore, stretchable circuit boards (one includes an LED 50, a capacitor 60, a resistor 70, and an inductor 80, and another included a low-pass filter) are manufactured, and the mechanical and electrical properties are measured.

Figure 11:
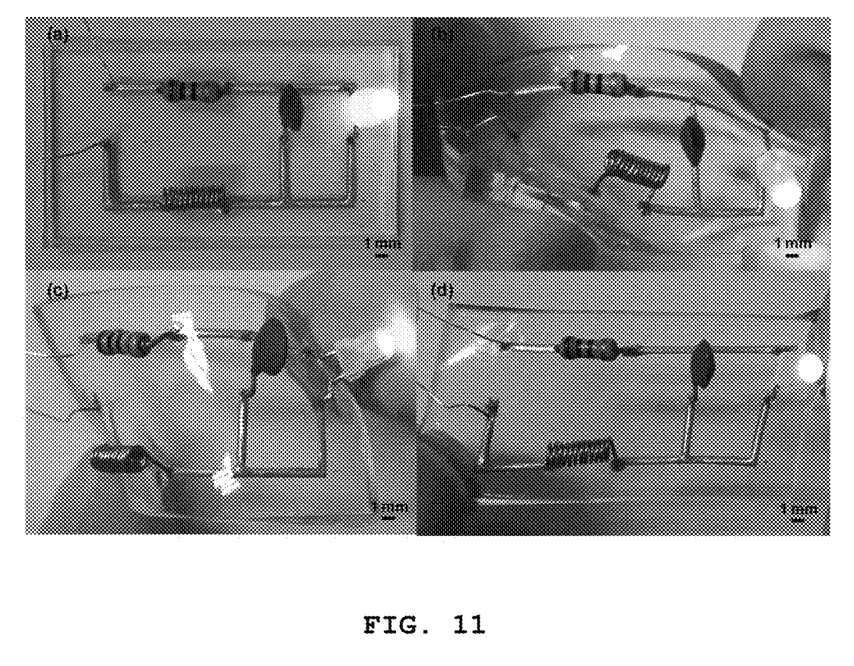
FIG. 11 illustrates the stretchable circuit board including a resistor, an inductor, a capacitor and a light-emitting diode according to the present invention, wherein the electrical properties are maintained even under deformation such as bending, twisting and stretching.

4-1. Stretchable Circuit Board integrated with LED, Capacitor, Resistor and Inductor The liquid metal wire was connected to the LED, the capacitor, the resistor, and the inductor. The stretchable circuit board including them is manufactured. The electrical properties are evaluated after applied with physical deformation such as bending, twisting, and off-axis stretching.

As illustrated in FIGS. 11(a) to 11(d), even after applied with deformation such as bending, twisting, or off-axis stretching, the light is still emitted from the LED device. Hence, the stretchable circuit board according to an embodiment of the present invention can be integrated with conventional electronic parts and widely utilized as a stretchable electronic device.

4-2. Stretchable Circuit Board Integrated with Low-Pass Filter

As illustrated in 12(a) to 12(f), and 12(g1) to 12(g3), the liquid metal wire according to an embodiment of the present invention is connected to a low-pass filter, a stretchable circuit board including them is manufactured, and the mechanical and electrical properties are measured. FIG. 12(a) shows the stretchable circuit board including the liquid metal wire connecting to the low-pass filter and FIG. 12(b) shows the circuit diagram of FIG. 12(a).

In order to evaluate the mechanical properties of the stretchable circuit board including the liquid metal wire used to connect the low-pass filter, as shown in FIGS. 12(c) to 12(f), physical deformation such as bending (90°), twisting (90°) and 30% stretching is applied, and the board is optically transparent despite such deformation.

Figure 12:
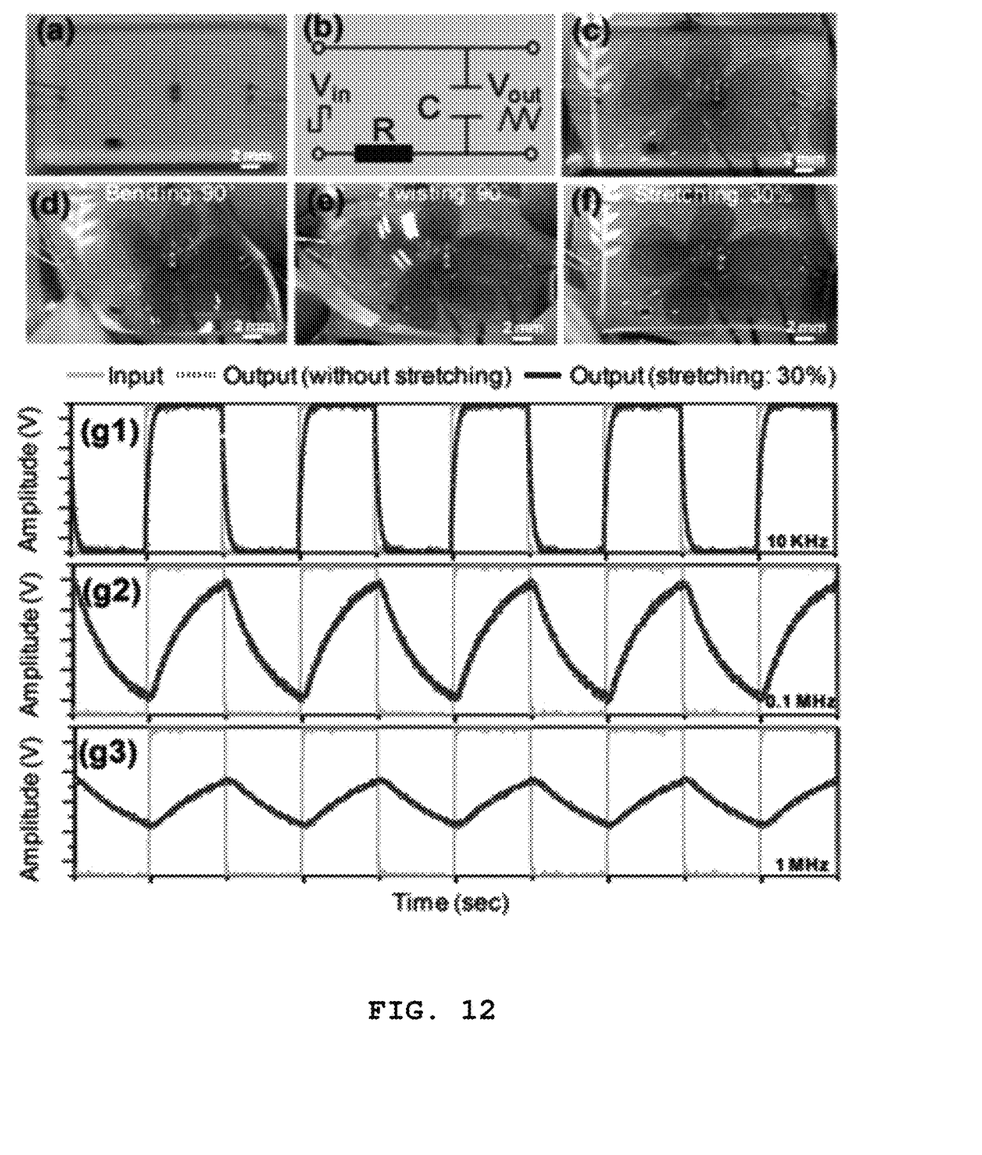
FIG. 12 illustrates the stretchable circuit board including a low-pass filter connected with a liquid metal wire, wherein the mechanical and electrical properties are maintained even under deformation such as bending, twisting and stretching.

In order to evaluate the electrical properties of the stretchable circuit board including the liquid metal wire used to connect the low-pass filter, a waveform is generated using a function generator, and an output signal ($V_{out}$) is measured using an oscilloscope. In this procedure, physical deformation such as stretching (30%) is applied, and the output voltage of the filter is measured at frequencies of 10 kHz, 0.1 MHz, and 1 MHz under non-stretching and stretching conditions.

As shown in FIGS. 12(g1) to 12(g3), the output waveform is very similar to the input waveform at a low frequency (10 kHz), but differed slightly therefrom. This is due to the charging of the capacitor. At a higher frequency (1 MHz), the output voltage is converted into a waveform with triangular-shaped compared with the input square-wave signal. This shaping of the waveform in the low-pass filter may be caused by frequency-dependent reactance of the capacitor.

As illustrated in FIGS. 12(g1) to 12(g3), the output waveforms are matched under non-stretching and stretching (30%) conditions. Thereby, the electrical performance of the stretchable circuit board including the liquid metal wire used to connect the low-pass filter, the electrical properties of manufactured stretchable filter in are stably maintained even after applied with physical deformation such as stretching.

Although the performed embodiments of the present invention have been disclosed for illustrative purposes, those skilled in the art are value-added due to that various modifications, additions and substitutions are possible, except the scope and spirit of the invention as disclosed in the accompanying claims. Therefore, the scope of the present invention should not be confined to the disclosed embodiments, and should be defined by all modifications or modified forms derived from the accompanying claims.

What is claimed is:

1. A method of manufacturing a stretchable circuit board, comprising steps of:
   (a) forming a first polymer layer on a surface of a wafer;
   (b) coating a surface of the first polymer layer with a metal film;
   (c) forming a pattern by selectively etching the metal film such that the pattern is formed by a remaining part of the metal film, wherein the metal film is formed after forming the first polymer layer;

(d) plating a reduced liquid metal on a top surface of the pattern formed by etching the metal film such that the reduced liquid metal directly contacts with a whole area of the top surface of the pattern, wherein said plating the reduced liquid metal is performed after forming the pattern; and (e) removing the wafer, wherein in the step (d), plating the reduced liquid metal on the pattern is performed based on a wettability of the reduced liquid metal, which varies depending on a material of the metal film on which the reduced liquid metal is plated.

2. The method of claim 1, wherein the first polymer layer is formed by coating stretchable materials including polydimethylsiloxane (PDMS) on the surface of the wafer.

3. The method of claim 1, wherein the metal film is formed by depositing metal on the first polymer layer, wherein the metal is selected from the group including gold (Au), chromium (Cr), silver (Ag), aluminum (Al), copper (Cu), platinum (Pt), zinc (Zn), nickel (Ni), tin (Sn), iron (Fe), and so on.

4. The method of claim 1, wherein the reduced liquid metal comprises gallium, indium and tin.

5. The method of claim 1, wherein the reduced liquid metal is obtained by removing an oxidized surface of a liquid metal by using a vapor of an acid solution, wherein the reduced liquid metal has higher wettability on a surface of a metal material than a polymer material.

6. The method of claim 5, wherein the acid solution is a hydrochloric acid (HCl) solution.

7. The method of claim 6, wherein the acid solution has a concentration of 15 to 37 wt %.

8. The method of claim 1, wherein the step (d) is performed by rolling the reduced liquid metal on surfaces of the pattern.

9. The method of claim 8, wherein the rolling the reduced liquid metal on the surfaces of the pattern is performed for 5 to 30 sec.

10. The method of claim 1, wherein the coating step comprises:

forming a chromium layer by coating the surface of the first polymer layer with chromium (Cr); and coating the chromium layer with gold (Au).

11. The method of claim 1, a second polymer layer is coated on a surface plated with a liquid metal after the step (d).

* * * * *